(12) United States Patent
Du et al.

(10) Patent No.: US 9,998,117 B2
(45) Date of Patent: Jun. 12, 2018

(54) SOLID STATE RESETTABLE FUSES

(71) Applicant: ABB Schweiz AG, Baden (CH)

(72) Inventors: Yu Du, Raleigh, NC (US); Hongrae Kim, Cary, NC (US); Taosha Jiang, Cary, NC (US)

(73) Assignee: ABB Schweiz AG, Baden (CH)

( * ) Notice: Subject to any disclaimer, the term of this patent is extended or adjusted under 35 U.S.C. 154(b) by 188 days.

(21) Appl. No.: 14/965,385

(22) Filed: Dec. 10, 2015

(65) Prior Publication Data
US 2017/0170824 A1    Jun. 15, 2017

(51) Int. Cl.
*H02H 5/04* (2006.01)
*H03K 17/94* (2006.01)
*H03K 17/687* (2006.01)

(52) U.S. Cl.
CPC ........... *H03K 17/94* (2013.01); *H03K 17/687* (2013.01)

(58) Field of Classification Search
CPC ...... H02H 5/04; H02H 5/047; H01L 2924/00; H01L 2924/0002
USPC ........................................................ 361/103
See application file for complete search history.

(56) References Cited

U.S. PATENT DOCUMENTS

| | | |
|---|---|---|
| 3,906,422 A | 9/1975 | Healy |
| 5,388,022 A | 2/1995 | Ahuja |
| 5,420,561 A | 5/1995 | Swensen |
| 5,561,579 A | 10/1996 | Gyugyi et al. |
| 5,691,689 A | 11/1997 | Smith et al. |
| 5,963,121 A | 10/1999 | Stygar et al. |
| 6,492,799 B1 * | 12/2002 | Rajala ............... H02H 3/046 324/86 |
| 7,206,178 B2 | 4/2007 | Friedrichs et al. |
| 8,289,122 B2 | 10/2012 | Matthiesen et al. |
| 8,686,826 B2 | 4/2014 | Chandler et al. |

(Continued)

FOREIGN PATENT DOCUMENTS

| DE | 102004046823 B3 | 12/2005 |
|---|---|---|
| EP | 104981 A1 | 4/1984 |

(Continued)

OTHER PUBLICATIONS

Cid et al. (Tyco Electronics), Arc-Suppressed Connectors for HVdc Applications, 2011 Green Building Power Forum, San Jose, CA, Jan. 24-26, 2011.

*Primary Examiner* — Dharti Patel
(74) *Attorney, Agent, or Firm* — Taft Stettinius & Hollister LLP

(57) ABSTRACT

A resettable solid state fuse that automatically restores an interrupted circuit after an overcurrent event is cleared. The resettable solid state fuse can include one or more switching devices, such as, for example, a normally-on power semiconductor, and one or more positive temperature coefficient (PTC) resistive elements. The switching device is structured to extend the voltage rating of the resettable fuse, allowing the solid state resettable fuse to attain both a relatively elevated voltage rating and a relatively elevated electrical current rating while using a PTC resistive element. According to certain embodiments, the solid state resettable fuse can be tripped by a cascaded PTC resistive element, thereby providing a passive electronic device that can operate in the absence of electronic sensing, detection, and tripping, as well as without reliance on an auxiliary power supply.

25 Claims, 7 Drawing Sheets

(56) References Cited

U.S. PATENT DOCUMENTS

| | | |
|---|---|---|
| 2004/0222406 A1 | 11/2004 | Chen et al. |
| 2011/0267132 A1 | 11/2011 | Lubomirsky et al. |
| 2015/0280417 A1 | 10/2015 | Shen |

FOREIGN PATENT DOCUMENTS

| | | |
|---|---|---|
| EP | 1538645 A1 | 6/2005 |
| GB | 1423510 | 2/1976 |
| SU | 1712978 A1 | 2/1992 |
| WO | 9203866 A1 | 3/1992 |
| WO | 0249215 A1 | 6/2002 |
| WO | 2008156448 A1 | 12/2008 |

* cited by examiner

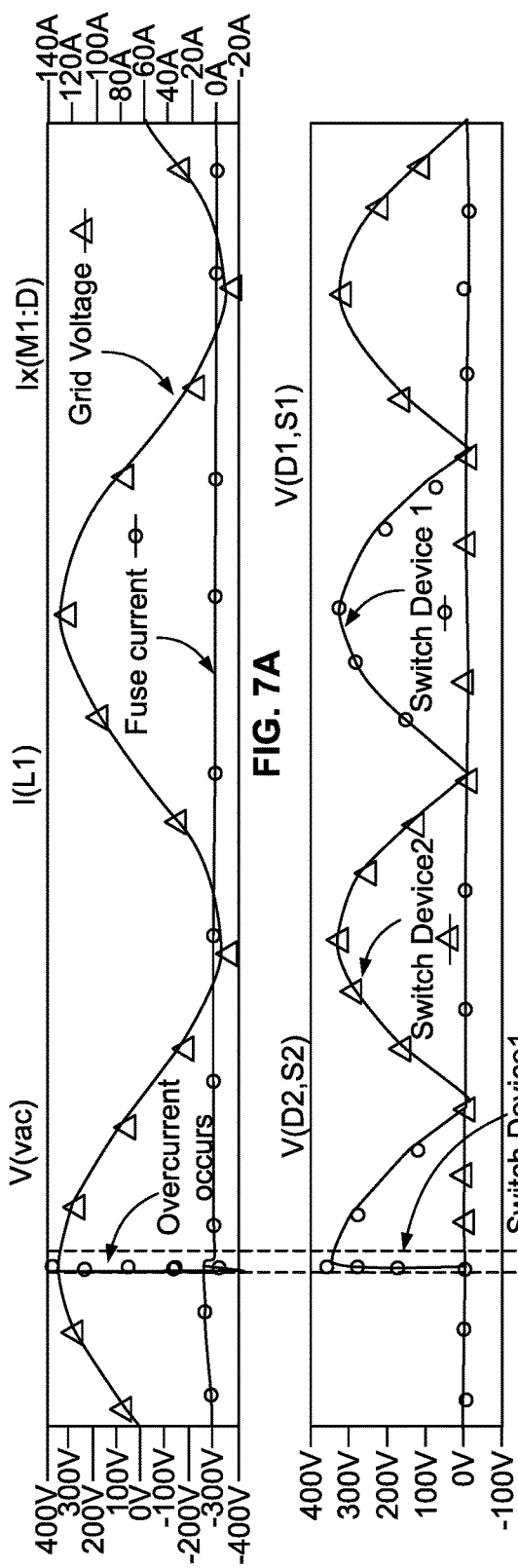
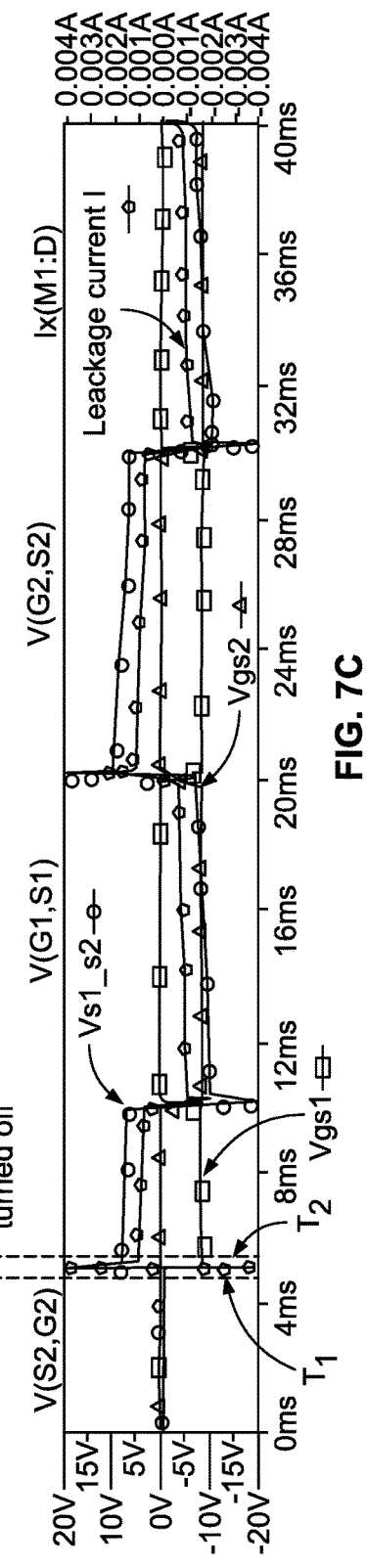
FIG. 7A
FIG. 7B
FIG. 7C

SOLID STATE RESETTABLE FUSES

BACKGROUND

Embodiments of the present application generally relate to resettable fuses. More particularly, but not exclusively, embodiments of the present application relate to solid state resettable fuse having both an elevated voltage and elevated electrical current rating.

Overcurrent protection devices traditionally have been utilized in the protection of cables, contactors, switches, equipment and individuals from hazards associated with excessive electrical current, including, for example, short circuits, overloading, mismatched loads, or device failure. Protection from the potentially dangerous and/or damaging effects of such overcurrent events can be implemented in a number of different manners, including, for example, by traditional fuses or mechanical circuit breakers. For example, traditional fuses may have a sacrificial element, such as a filament, that melts and/or breaks when the electrical current flowing therethrough exceeds a threshold limit, thereby facilitating a break or interruption in the associated circuit. Similarly, certain breakers may utilize a bimetallic strip that, when current flowing therethrough exceeds a threshold value, bends or otherwise deforms to a position that can contact another component of the breaker that triggers the tripping of the breaker. However, after such overcurrent protection devices trip or interrupt the circuit, the overcurrent protection devices typically need to be serviced before the operation of the circuit can be restored. Yet, such servicing often involves the manual replacement of the broken fuse and/or resetting of the breaker. Such manual resetting and/or replacement of traditional overcurrent protection devices can be particularly challenging and costly when the overcurrent protection device is remote, hard to reach, and labor intensive.

Positive temperature coefficient (PTC) resettable fuses can also be used to protect against overcurrent faults in electronic circuits, including, for example, polymer positive temperature coefficient (PPTC) resettable fuses. PPTC resettable fuses can be constructed from a blend of polymer and conductive particles that can create networks of conductive paths through which electrical current may flow through the PPTC resettable fuse during normal operating conditions. However, when the electrical current flowing through the PPTC resettable fuse exceeds a threshold current limit, the temperature of the PPTC resettable fuse may be elevated beyond a threshold temperature. Such elevations in temperature beyond the threshold temperature can trip the PPTC resettable fuse, wherein the electrical resistance of the PPTC resettable fuse relatively rapidly increases by several orders of magnitude. For example, in certain situations, when the temperature of the PPTC resettable fuse is elevated above the threshold temperature, the electrical resistance of the PPTC resettable fuse can be hundreds or thousands of ohms. Further, as power sources can have a finite voltage, such an elevation in the electrical resistance of the PPTC resettable fuse can subsequently reduce the electrical current flowing through the PPTC resettable fuse.

As traditional PTC resettable fuses have relatively limited voltage or current ratings, PTC resettable fuses typically have difficulty in accommodating both a relatively high current and a relatively high voltage. For example, when the voltage rating of a PTC resettable fuse is relatively low, such as, for example, around 15 volts (V), the maximum fault current at which the PTC resettable fuse will withstand at rated voltage without damaging the fuse, also referred to as maximum current, can be as high as 50 A. However, as the voltage rating of resettable fuses increase, the maximum current of those fuses typically decreases. For example, certain PTC resettable fuses having a voltage rating of around 72 volts to around 120 volts can have a maximum current of only 6 amps (A) to 7.5 amps. Conversely, while certain PTC resettable fuses having a voltage rating of 240 V, the associated maximum current may only be around 4 amps. Further, when the voltage rating of such resettable fuses further increases to hundreds of volts, the maximum current of PTC resettable fuses often are reduced to tens to hundreds of milliamps (mA). For example, certain PTC resettable fuses having a current rating of 1000 volts can have a maximum current of only 17 mA. Accordingly, the inability to attain both high current and high voltage can limit the application of PTC resettable fuses to certain technologies and devices.

BRIEF SUMMARY

An aspect of an embodiment of the present application is a solid state resettable fuse that includes a positive temperature coefficient resistive component that is automatically resettable from a high electrical resistance state to a low electrical resistance state. The positive temperature coefficient resistive component includes a resistance to a flow of an electrical current through the positive temperature coefficient resistive component, the resistance being higher for the high electrical resistance state than for the low electrical resistance state. The solid state resettable fuse also includes a normally-on switch device having a control terminal electrically coupled to the positive temperature coefficient resistive component. The control terminal can be configured to receive a control signal, such as, for example, a gate-source voltage, at least when the positive temperature coefficient resistive component is in the high electrical resistance state. Additionally, the control terminal can be configured to adjust the normally-on switch device from an on state to a tripped state in response to the received control signal.

Another aspect of an embodiment of the present application is a solid state resettable fuse having a positive temperature coefficient resistive component that has a low electrical resistance state and a high electrical resistance state. The positive temperature coefficient resistive component can be configured to reset from the high electrical resistance state to the low electrical resistance state in response to a temperature of the positive temperature coefficient resistive component being below a threshold temperature. The solid state resettable fuse can also include a first normally-on switch device in a cascade arrangement with the positive temperature coefficient resistive component. The first normally-on switch device is adjustable from at least a first on state to a first tripped state in response to at least the positive temperature coefficient resistive component being transitioned from the low electrical resistance state to the high electrical resistance state. Additionally, the solid state resettable fuse can output a leakage electrical current at least when the first normally-on switch device is in the first tripped state.

A further aspect of an embodiment of the present application is a method that includes creating, in response to an overcurrent event, a voltage drop across a positive temperature coefficient resistive component. Further, a gate-source voltage can be adjusted in response to the created voltage drop. In response to the adjusted gate-source voltage, the normally-on power semiconductor device can be adjusted from an on state to a tripped state. Additionally, the method can include interrupting a circuit when the normally-on power semiconductor is adjusted to the tripped state, and wherein a leakage current can flow from the normally-on power semiconductor device when in the tripped state.

BRIEF DESCRIPTION OF THE DRAWINGS

The description herein makes reference to the accompanying figures wherein like reference numerals refer to like parts throughout the several views.

FIGS. 7A-7C illustrate examples of trip waveforms and voltage blocking waveforms of an exemplary bidirectional solid state resettable fuse.

Figures 1A, 1B, 1C:
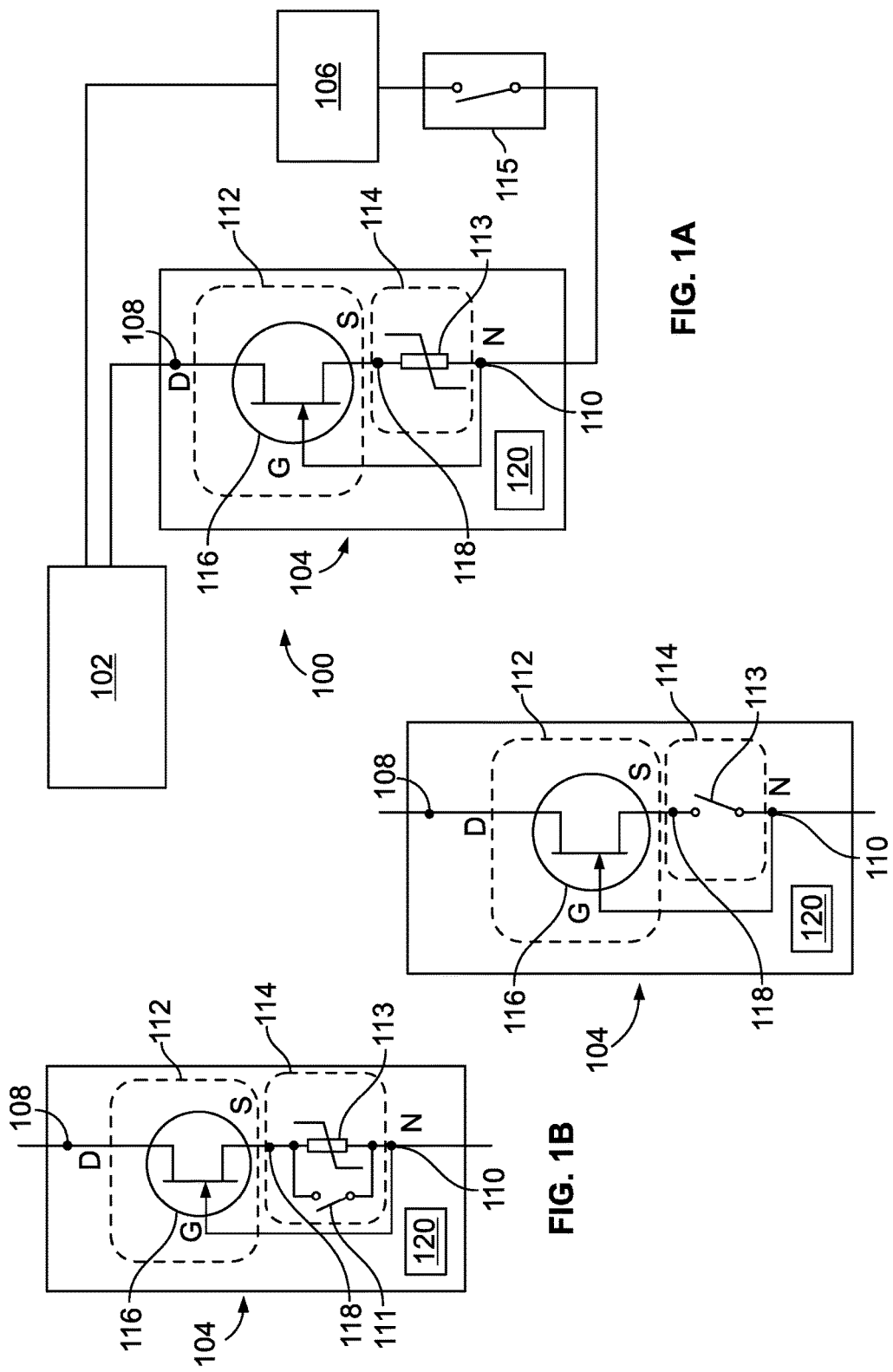
FIG. 1A illustrates a schematic representation of a circuit having an exemplary unidirectional solid state resettable fuse.
FIG. 1B illustrates an exemplary embodiment of a solid state resettable fuse having a PTC resistive component that includes a parallel connected hybrid bi-metal or memory shape alloy resistor and PTC resistor.
FIG. 1C illustrates an exemplary embodiment of a solid state resettable fuse having a PTC resistive component that includes a bi-metal or memory shape alloy resistor.

The foregoing summary, as well as the following detailed description of certain embodiments of the present invention, will be better understood when read in conjunction with the appended drawings. For the purpose of illustrating the invention, there is shown in the drawings, certain embodiments. It should be understood, however, that the present invention is not limited to the arrangements and instrumentalities shown in the attached drawings. Further, like numbers in the respective figures indicate like or comparable parts.

DESCRIPTION OF THE ILLUSTRATED EMBODIMENTS

Certain terminology is used in the foregoing description for convenience and is not intended to be limiting. Words such as "upper," "lower," "top," "bottom," "first," and "second" designate directions in the drawings to which reference is made. This terminology includes the words specifically noted above, derivatives thereof, and words of similar import. Additionally, the words "a" and "one" are defined as including one or more of the referenced item unless specifically noted. The phrase "at least one of" followed by a list of two or more items, such as "A, B or C," means any individual one of A, B or C, as well as any combination thereof.

FIG. 1A illustrates a schematic representation of a circuit 100 having an exemplary unidirectional solid state resettable fuse 104. As shown, the circuit 100 can include one or more power sources 102, one or more solid state resettable fuses 104, and one or more loads 106. The power source 102 may take a variety of different forms, including, for example, power from a utility power source or an electrical energy storage device, such as, for example, electrochemical cells or batteries, capacitors, supercapacitors, flywheels, among other power sources. Further, the power source 102 may be configured to supply AC or DC power. Further, according to certain embodiments, the power source can include an inverter or converter that may be configured to convert one of AC and DC power from the power source 102 to the other of AC and DC power. Further, the power source 102 may be electrically coupled to the solid state resettable fuse 104 in a number of manners, including, but not limited to, connected to a positive terminal of the power source 102 via a line side fuse terminal(s) 108 (represented by the "D" terminal in FIG. 1A) of the solid state resettable fuse 104.

Similarly, the load 106 may be electrically coupled to the solid state resettable fuse 104 in a number of manners. For example, according to certain embodiments, the load 106 may be electrically coupled to a load side fuse terminal(s) 110 (represented by "N" the terminal in FIG. 1A) of the solid state resettable fuse 104. A variety of different types and/or combinations of devices or equipment may be utilized for the load 106. For example, according to certain embodiments, the load 106 may be a relatively low voltage application, such as, for example, applications in which operation of the load 106 involves the circuit 100 supplying the load 106 with relatively small voltages of around 200 volts or less. Alternatively, according to certain embodiments, the load 106 may be associated with relatively high voltage applications, including, but not limited to, operations in which the load 106 is supplied with voltages in excess of 200 volts. Further, for at least purposes of illustration, FIG. 1A schematically depicts the load 106 being electrically coupled to the power source 102, such as, for example, electrically coupled to a negative terminal of the power source 102.

The solid state resettable fuse 104 is configured to operate during normal operating conditions in a relatively low electrical resistance state. For example, according to certain embodiments, when in the low electrical resistance state, the solid state resettable fuse 104 may have a resistance that varies from a relatively small or nominal resistance, such as, for example, a few milliohms to ten of milliohms, and more specifically, for example, around 1-10 milliohms (mΩ). However, during certain conditions and/or in response to certain overcurrent events, such as, for example, in response to short circuits, overloading, mismatched loads, or device failure, among other events and/or conditions, the solid state resettable fuse 104 may operate in a relatively high electrical resistance, tripped state. For example, according to certain embodiments, when in the high electrical resistance state, the solid state resettable fuse 104 may have a resistance that can be around, or exceed, 20 kilohms (k) (kΩ). However, in addition to the above examples of resistance ranges for the low and high electrical resistance states, other ranges of resistances may be identified for the low and high electrical resistance states of the solid state resettable fuse 104. Further, according to certain embodiments, when operating in a high resistance, tripped state, a small amount of electrical current (I), referred to as a leakage current, may still pass through the solid state resettable fuse 104 and be available at least at the load side terminal 110 of the solid state resettable fuse 104. For example, according to certain embodiments, the relatively small or leakage current can be, but is not limited to, around 1 milliamp (mA) to around 10 milliamp (mA). Further, the leakage current can at least assist in keeping one or more positive temperature coefficient (PTC) resistors or resistive components 114 of the solid state resettable fuse 104 in high resistance state, and therefore maintain the solid state resettable fuse 104 in the tripped state.

According to certain embodiments, the solid state resettable fuse 104 includes at least one normally-on switch device 112 and at least one PTC resistive component 114. The solid state resettable fuse 104 can be configured to utilize the detection, tripping, and automatic resetting functions of the PTC resistive component 114, and voltage blocking features of a normally-on switch device 112, such as, for example, major voltage blocking characteristics of a wide-bandgap (WBG) power semiconductor device, to provide a relatively high voltage rated resettable fuse that can also have a relatively high current rating. As discussed below, according to such an embodiment, the PTC resistive component 114 can control the resistance of the cascaded normally-on switch device 112. Moreover, as discussed below, during an overcurrent event, the PTC resistive component 114 can experience an increase in the electrical current flowing through the PTC resistive component 114 that facilitates a temperature of the PTC resistive component 114 being elevated to, or beyond, a threshold temperature, wherein the PTC resistive component 114 transitions from a relatively low electrical resistance state to a relatively high electrical resistance state. According to certain embodiments, such a change in the electrical resistance of the PTC resistive component 114 can result in a change in a gate-source voltage (Vgs) delivered to a control terminal 116, with respect to the source terminal (S) 118, of the normally-on switch device 112 that alters the resistance or conductivity of the normally-on switch device 112. Further, the level of the gate-source voltage (Vgs) delivered to the normally-on switch device 112, which can be influenced by at least the electrical resistance and/or temperature characteristics of the PTC resistive component 114, can influence changes, and the associated speed of such changes, in the resistance and/or conductivity of the normally-on switch device 112. Moreover, such changes in the gate-source voltage (Vgs) can result in the normally-on switch device 112 rising toward and/or entering into a tripped state wherein electrical current passing through the normally-on switch device 112 is decreased to a relatively small amount of current, such as, for example, a leakage current, thereby resulting in the solid state resettable fuse 104 tripping or otherwise interrupting the associated circuit.

Further, after the overcurrent event is cleared, such as, for example, after a fault that resulted in the tripping of the PTC resistive component 114, is cleared, the temperature of the PTC resistive component 114 can be reduced to a level below the threshold temperature. Such a reduction in the temperature of PTC resistive component 114 can result in the PTC resistive component 114 to the relatively low electrical resistance state, thereby automatically resetting the PTC resistive component 114 and also facilitate the automatic return or resetting of the normally-on switch device 112 from a tripped state to an on state wherein the solid state resettable fuse 104 is not interrupting the associated circuit. Further, such automatic resetting of the solid state resettable fuse 104 can, in at least certain situations, generally be attained without service to the solid state resettable fuse 104.

Thus, compared to traditional fuses that break in response to a single overcurrent event, and which subsequently are replaced by another similar breakable fuse after the overcurrent event is cleared, the solid state resettable fuse 104 of the present application can be structured to operate over a relatively large number of cycles or overcurrent events, such as, for example, hundreds of cycles. Further, while certain types of traditional breakers may need to be manually reset by service personal each time after being tripped, the solid state resettable fuse 104 of the present application can automatically reset after the associated overcurrent event, such as the associated fault, is cleared.

A variety of different types of devices may be utilized for the normally-on switch device 112, including, but not limited to, the normally-on, or depletion mode, WBG power semiconductor device. For example, the normally-on switch device 112 can include, but is not limited to, a silicon carbide (SiC) junction gate field-effect transistor (JFET or JUGFET), a gallium nitride (GaN) high electron mobility transistor (HEMT), a heterostructure FET (HFET), or a modulation doped FET (MODFET), among other devices. Further, as illustrated by at least FIG. 1A, according to certain embodiments, the normally-on switch device 112 can include a control terminal 116, such as, for example, a gate, among other control terminals. As shown, the control terminal 116 can be in electrical communication with the load side terminal (N terminal) 108 of the solid state resettable fuse 104. Additionally, according to certain embodiments, the control terminal 116 may be employed in controlling the level of current outputted from the normally-on switch device 112.

Figure 1D:
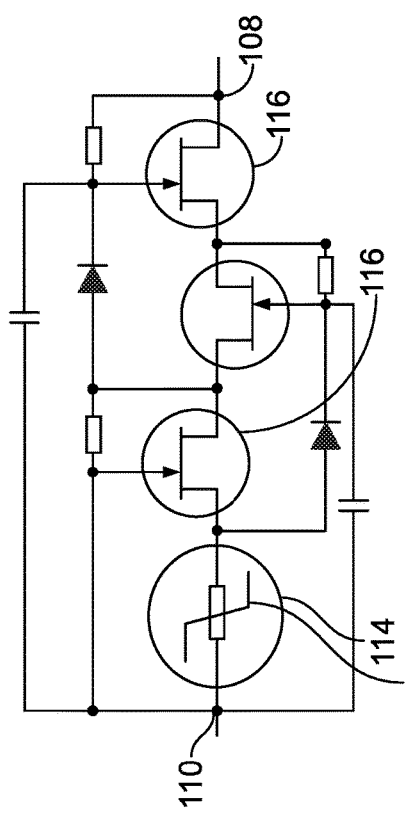
FIG. 1D illustrates an exemplary embodiment of a solid state resettable fuse having a PTC resistive component and a plurality of normally-on switch devices in a super cascade arrangement.

According to certain embodiments, the line side terminal(s) (D terminal) 108 of the solid state resettable fuse 104 may be electrically coupled to an input of the PTC resistive component 114. Further, as depicted in FIGS. 1A and 1D, according to certain embodiments, one or more of the PTC resistive component 114 and one or more of the normally-on switch device 112 of the solid state resettable fuse 104 can be configured in a cascade, or super cascade, arrangement. As depicted in FIG. 1A, according to certain embodiments, such a cascade arrangement can include a source terminal 118 (indicated by the "S" terminal in FIG. 1A) that is electrically coupled to an output of the PTC resistive component 114 and an inlet of the normally-on switch device 112. Moreover, according to certain embodiments, the source terminal 118 is, or is located at or around, an input terminal of the normally-on switch device 112. Super cascade of the normally-on switch devices 112, as shown in FIG. 1D, may further increase the voltage blocking rating of the solid state resettable fuses 104.

The PTC resistive component 114 can be a passive electronic component used to protect against overcurrent faults in electronic circuits. According to certain embodiments, the PTC resistive component 114 may be an extra-low voltage (ELV) PTC resettable fuse, such as, for example, a 12 volt to 42 volt ELV PTC resistor. Further, a variety of devices can be utilized as the PTC resistive component 114. For example, according to certain embodiments, the PTC resistive component 114 can be a polymeric positive temperature coefficient device (PPTC) resettable fuse, which can also be referred to as a poly-fuse or poly-switch.

According to embodiments in which the PTC resistive component 114 is a PPTC resettable fuse, ploy-fuse, or poly-switch 113, the PTC resistive component 114 can include a blend of a polymer and conductive particles. Under generally normal operating conditions, the conductive particles may be arranged or positioned relative to the polymer and between one or more pairs of electrodes or conductive elements such that the conductive materials form conductive pathways for the flow of electrical current between the electrodes or conductive members with relatively low resistance. Thus, according to such embodiments, under generally normal operating conditions, the PTC resistive component 114 can be in a relatively low electrical resistance state.

However, according to such embodiments, upon the occurrence of an overcurrent event, such as, for example, upon the occurrence of a fault in the circuit 100, the PTC resistive component 114 may experience an increase in the flow of electrical current through the PTC resistive component 114 that can elevate the temperature of the PTC resistive component 114 to or above a threshold resistor temperature. In such an event, the polymer may melt, thereby increasing the volume or the thickness of the polymer. Further, such changes in the polymer may facilitate the breaking of at least some of the pathways of conductive particles that extend between the electrodes or conductive members. Such reductions and/or elimination of at least some of the conductive pathways can increase the level of resistance of the PTC resistive component 114 such that the PTC resistive component 114 transitions to a relatively high electrical resistance state. Further, according to certain embodiments, when in the high electrical resistance state, the resistance of the PTC resistive component 114 may be several orders of magnitude higher than the resistance of the PTC resistive component 114 when operating in the low electrical resistance state. Accordingly, when in the high electrical resistance state, the level of electrical current outputted from the PTC resistive component 114 can be relatively small, thereby at least attempting to protect the associated load 106 and/or individuals from the hazards associated with the overcurrent event. The PTC resistive component 114 may subsequently automatically return to the low electrical resistance state by a decrease or stoppage in the flow of electrical current through the PTC resistive component 114, and an associated reduction in the temperature of the PTC resistive component 114 to a level that is below the threshold temperature. For example, according to certain embodiments, the flow of electrical current through the solid state resettable fuse 104 may be interrupted by a disconnection of the power source 102 or load 106 from the associated line side terminal 108 or load side terminal 110, or another interruption in the circuit 100, such as, for example, by the opening of a switch that ceases the flow of associated current from the power source 102.

While the above exemplary embodiment of the PTC resistive component 114 has been discussed with respect to a PPTC resistor 113, a variety of other devices can be employed as the PTC resistive component 114. For example, according to certain embodiments, the PTC resistive component 114 may be a bi-metal or memory shape alloy based thermal breaker. According to such embodiments, under generally normal operating conditions, the PTC resistive component 114 can have a first shape that accommodates the presence of a conductive pathway for the flow of electrical current through the PTC resistive component 114 and/or the associated circuit 100. However, when the temperature of such a PTC resistive component 114 reaches or exceeds a threshold temperature, the shape and/or orientation of the PTC resistive component 114 may change to a second shape, which can cause an interruption in the conductive pathway, and thus an opening in the PTC resistive component 114 and/or associated circuit 100. Moreover, such an interruption can prevent or minimizes the output of electrical current through the PTC resistive component 114. Similar to the PPTC resistor 113, following removal or clearing of the overcurrent event, the temperature of the bi-metal or memory shape alloy based thermal breaker may subsequently be reduced to a temperature below the threshold temperature, and the shape of the bi-metal or memory shape alloy based thermal breaker may automatically return to the first shape. With the bi-metal or memory shape alloy based thermal breaker returned to the first shape, the conductive pathway through the PTC resistive component 114 can be automatically reset or restored.

As depicted in the exemplary embodiment FIG. 1B, according to certain embodiments, the PTC resistive component 114 may include a parallel connected hybrid bi-metal or memory shape alloy resistor 111 and PPTC resistor 113. According to such an embodiment, the bi-metal or memory shape alloy resistor 111 can have a higher current rating than the PPTC resistor 113, and the PPTC resistor 113 may avoid the arcing associated with opening of the bi-metal or memory shape alloy resistor 111. Additionally, according to such an embodiment, while the PTC resistive component 114 operates in a low electrical resistance state, the resistance of the bi-metal or memory shape alloy resistor 111 may be less than the resistance of the PPTC resistor 113. However, during an overcurrent event, the resistance of the bi-metal or memory shape alloy resistor 111 may increase to a level that is greater than the resistance of the PPTC resistor 113. Further, the bi-metal or memory shape alloy resistor 111 may eventually open, such as, for example, open when the PTC resistive component 114 reaches the high electrical resistance state. Additionally, the bi-metal or memory shape alloy resistor 111 may remain in the open position, as shown in FIG. 1B, while the PTC resistive component 114 is in the high electrical resistance state and while a leakage current passes through the PTC resistive component 114, and more specifically, through the PPTC resistor 113. Alternatively, as illustrated in FIG. 1C, according to certain embodiments, the PTC resistive component 114 may comprise the bi-metal or memory shape alloy resistor 111 without the inclusion of the PPTC resistor 113.

Figure 2:
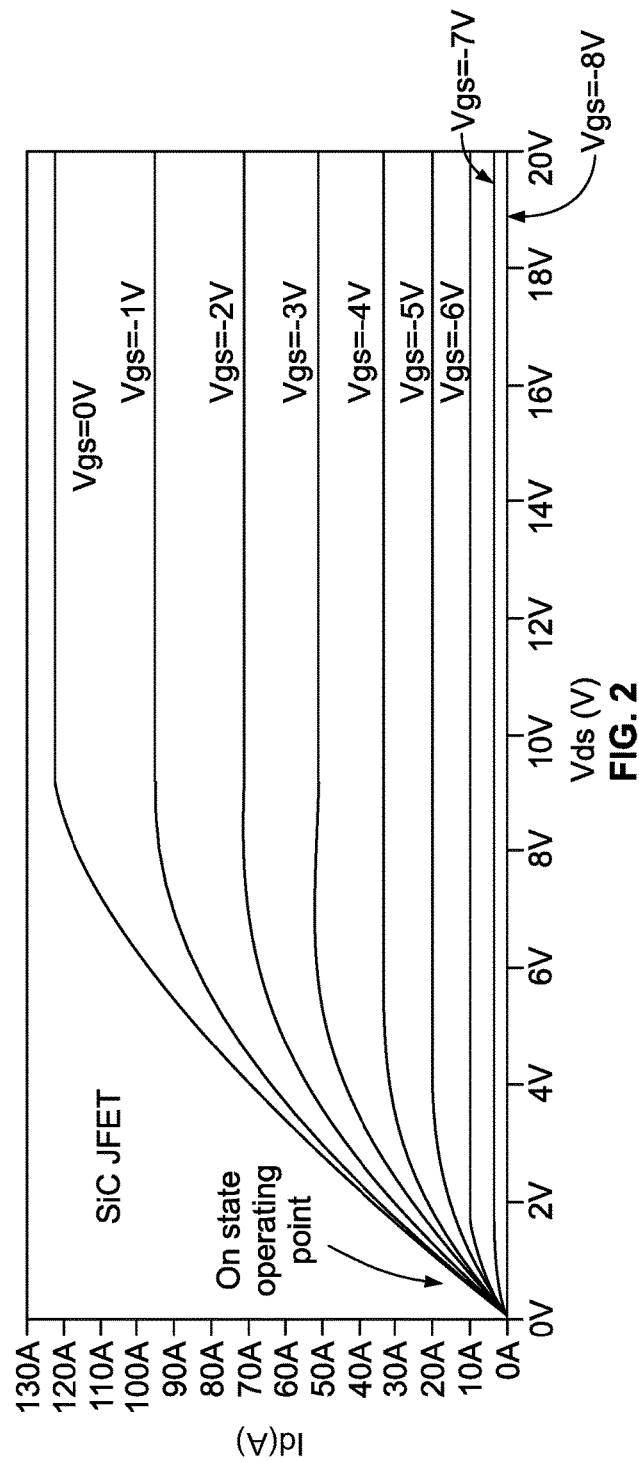
FIG. 2 illustrates exemplary electrical current and voltage characteristics of at least certain types normally-on switch devices.

FIG. 2 illustrates exemplary electrical current and voltage characteristics of at least certain types of normally-on switch devices 112. Moreover, FIG. 2 illustrates electrical drain current (Id), as measured in amps (A), and drain-source voltage (Vds) characteristics of an exemplary normally-on switch device 112 that is a normally-on power semiconductor device, and more specifically, is a 1200 volt SiC JFET having a continuous current rating of 23 amps (A) at 125 degrees Celsius. According to the present example, when a gate control voltage or gate-source voltage (Vgs) is equal to zero volts (0V), the normally-on switch device 112 is turned to, or otherwise is in, an on state. With the normally-on switch device 112 in the on state, the normally-on switch device 112 behaves similar to a resistor in the linear region when the associated drain current (Id) is relatively small. However, as the drain current (Id) or drain-source voltage (Vds) increases, the switch current of the normally-on switch device 112 starts saturating, wherein further increases in the drain-source voltage (Vds) have little to no effect on the drain current (Ids).

The saturating current of the normally-on switch device 112 can be controlled by the gate-source voltage (Vgs). For example, as demonstrated by the example depicted in FIG. 2, for a normally-on power semiconductor, the saturating current is relatively high, such as, for example, above 120 amps (A), at a gate-source voltage (Vgs) that is at zero volts (Vgs=0V). However, as demonstrated by at least FIG. 2, the saturating current of such a normally-on switch device 112 can be reduced when the gate-source voltage (Vgs) becomes negative. Moreover, FIG. 2 demonstrates, in the present example, the effect of −1V incremental differences gate source voltage (Vgs) has on at least the corresponding saturating current. As shown, while a gate-source voltage (Vgs) that is at zero volts (Vgs=0V) can result in a saturating current around above 120 amps, a reduction in the gate-source voltage (Vgs) to around negative 8 volts (−8V) can correspond in a saturating current that approaches zero amps (0 A). Additionally, as shown in FIG. 2, in the depicted example, when the gate-source voltage (Vgs) is around negative 8 volts (−8V), which can correspond to the threshold voltage, the switch current is almost turned off.

As the gate voltage range of certain normally-on switch device 112, such as, for example, at least certain normally-on power semiconductors, including at least some SiC JFETs, can be from around zero volts (0V) to around negative twenty volts (−20V), and can have a threshold voltage of around negative eight volts (−8V), the voltage rating of the PTC resistive component 114 used with the solid state resettable fuse 104 can, in at least some instances, be selected between the lowest threshold voltage of the normally-on switch device 112 and the lowest of the gate-source voltage (Vgs) range. For example, according to certain embodiments, the solid state resettable fuse 104 can include a PTC resistive component 114 having a fifteen volt (15V) voltage rating. In such an example, as the required voltage rating of the PTC resistive component 114 is generally in the extra-low voltage (ELV) range, a relatively high degree of flexibly can be available in the selection of the current rating of the PTC resistive component 114. For instance, the trip current for fifteen volt (15V) PTC resistors can range from a few milliamps to fifty amps (50 A).

Further, the trip current of the PTC resistive component 114 can be at least a factor in establishing the trip current of the solid state resettable fuse 104. However, as previously mentioned, while the current rating of the extra-low voltage (ELV) PTC resistor typically can meet the requirements of a number of industrial applications, the voltage rating of traditional PTC resistors typically is too low for use in higher voltage applications. Yet, as discussed, the solid state resettable fuse 104 of the present application can overcome such problems by combining such extra-low-voltage PTC resistors with one or more normally-on switch devices 112, such as normally-on power semiconductors, in a cascaded manner.

Figure 3:
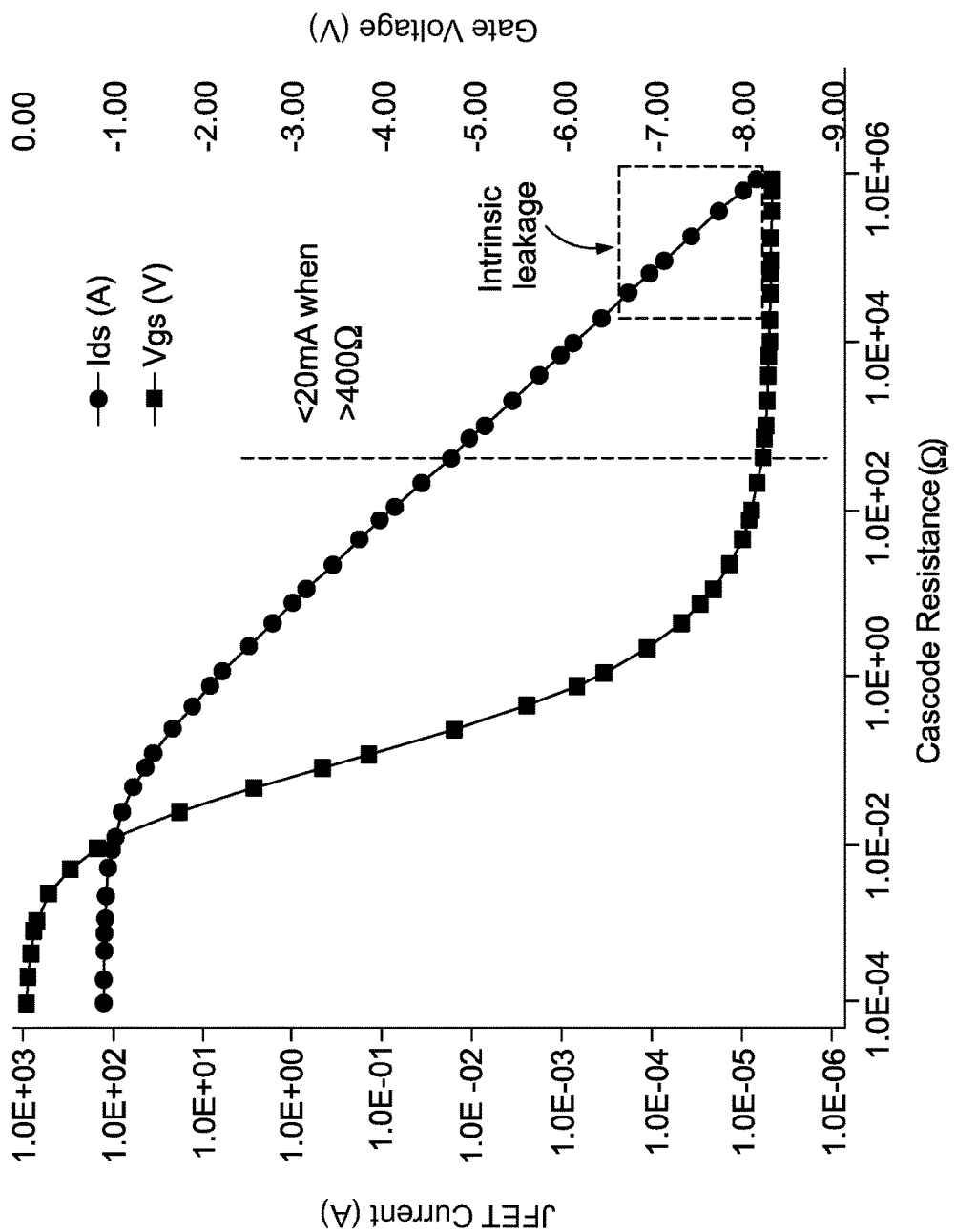
FIG. 3 illustrates electrical current of an exemplary solid state resettable fuse of the present application as a function of the electrical resistance of a PTC resistive component of the solid state resettable fuse.

FIG. 3 illustrates electrical current of an exemplary solid state resettable fuse 104 of the present application as a function of the electrical resistance of the PTC resistive component 114 of the solid state resettable fuse 104. As illustrated, information relating to the current (Ids) of the normally-on switch device 112 corresponds to the left vertical axis of the illustrated graph, while information corresponding to the gate-source voltage (Vgs) is provided by the right vertical axis. The electrical resistance characteristics of the PTC resistive component 114 can influence the duration of time until the gate-source voltage (Vgs) that is supplied to the control terminal attains a voltage level that can transition the normally-on switch device 112 from the on state to the tripped state, and thus influence the duration of time until the solid state resettable fuse 104 can attain the tripped state. Moreover, as demonstrated by FIG. 3, the electrical current of the solid state resettable fuse 104 can be controlled or otherwise influenced by a resistance value of the PTC resistive component 114 via the cascaded normally-on switch device 112 and the PTC resistive component 114.

In such embodiments, when the electrical resistance of the PTC resistive component 114, also referred to in FIG. 3 as cascode resistance, is in a relatively low electrical resistance range, such as, for example, a few milliohms (mΩ) to tens of milliohms (mΩ), the maximal current, such as, for example, a pulse of electrical current of 400 volts DC power source applied to the fuse terminals of the solid state resettable fuse 104 (such as the D and N terminals in FIG. 1A) for short periods of time, can be hundreds of amperes. In such situations, the electrical current will create a voltage drop across the PTC resistive component 114 that is inversely applied to the gate-source voltage of the normally-on switch device 112, such as, for example, the power semiconductor, to create a negative gate-source voltage (Vgs), also identified in FIG. 3 as "Gate Voltage (V)". However, if the resistance of PTC resistive component 114 is relatively low, the created negative gate-source voltage (Vgs) is relatively small, such as, for example, between zero volts (0V) and negative one volt (−1V), as shown in the example depicted in FIG. 3. In such a situation, the solid state resettable fuse 104 can remain in an on state such that the solid state resettable fuse 104 does not interrupt the flow of electrical current through at least the solid state resettable fuse 104.

As previously mentioned, the trip characteristics of the solid state resettable fuse 104 can be determined or otherwise influenced by the trip ($I^2t$) characteristics of PTC resistive component 114. More specifically, as previously discussed, when an overcurrent event occurs, and the temperature of the cascaded PTC resistive component 114 is elevated, the electrical resistance of the PTC resistive component 114 is also increased. As shown in FIG. 3, such an increase in the electrical resistance of the PTC resistive component 114 can reduce the saturating current (Ids) of the normally-on switch device 112, such as reduce the saturating current of the SiC JFET, as the solid state resettable fuse 104. With an increase in the resistance of the PTC resistive component 114, the current passing through the PTC resistive component 114 leads to a larger negative gate-source bias voltage (Vgs), which can reduce the saturating current of the normally-on switch device 112, as discussed above with respect to FIG. 2 and as shown by the right side vertical axis in FIG. 3. Moreover, the larger negative gate-source bias voltage (Vgs) can further facilitate the transition, and/or speed of such a transition, of the normally-on switch device 112 from being in the on state to the tripped state.

In the example provided by FIG. 3, the PTC resistive component 114 may be tripped when the electrical resistance value of the PTC resistive component 114 reaches or exceeds a PTC resistance threshold value of 400 ohms (Ω). In such a situation, as shown by the right side vertical axis, the gate-source voltage (Vgs) can be negatively increased beyond negative eight volts (−8V), which, in the example discussed above with respect to FIG. 2, can be around the turn-off or tripped state threshold of at least certain types of normally-on switch device 112, including certain types of SiC JFET. Thus, at least in certain embodiments, when supplied with a negative eight (−8V) gate-source voltage (Vgs), the normally-on switch device 112 may change from being in the on state to the tripped state. Yet, when in the tripped state, a small amount of leakage current can continue to pass through the normally-on switch device 112, as well as the solid state resettable fuse 104. Moreover, in the present example, with the electrical resistance of the PTC resistive component 114 reaching or exceeding the PTC resistance threshold value, which in this example is 400 ohms (Ω), the electrical leakage current of the solid state resettable fuse 104 can be reduced to less than twenty milliamps (20 mA) with a 400 volt DC power source voltage applied across the two fuse terminals, such as, for example, the N and D terminals, of the solid state resettable fuse 104. After this point, if the electrical resistance of the PTC resistive component 114 is further increased, the electrical leakage current of the solid state resettable fuse 104 can continue to decrease.

Further, as shown also shown in FIG. 3, when the electrical resistance of the PTC resistive component 114 is in the range of 100 kilohms (kΩ) to 1 megohms (MΩ), the electrical current of the solid state resettable fuse 104 can be at the same level as an intrinsic leakage current as the previously discussed example SiC JFET if a negative twenty volt (−20V) gate-source voltage (Vgs) where to be alternatively applied to the SiC JFET without the cascaded PTC resistive component 114.

In view of the foregoing, the cascaded PTC resistive component 114 of the solid state resettable fuse 104 can effectively turn the normally-on switch device 112 to an on state, such as the SiC JFET in the preceding example, when the fuse current is in a relatively small or leakage current range and the temperature of the PTC resistive component 114 is relatively low. In such situations, the overall resistance of the solid state resettable fuse 104 can be relatively small, and generally may equal the sum of the electrical resistance from the normally-on switch device 112 and the PTC resistive component 114. Further, the tripping of the PTC resistive component 114, such as, for example, by the occurrence of an overcurrent event, as previously discussed, can initiate the tripping of the solid state resettable fuse 104. In such a situation, if the electrical resistance of the PTC resistive component 114 exceeds the PTC resistance threshold value, such as, for example, 400 ohms (400Ω) in the example discussed above with respect to FIG. 3, the normally-on switch device 112, such as a SiC JFET, can be controlled as a function of the PTC resistance value. Additionally, in such a situation, the normally-on switch device 112 can also be transitioned to a high electrical resistance state as well, such as, for example, by operation of the control terminal 116 of the normally-on switch device 112.

Additionally, with the PTC resistive component 114 and normally-on switch device 112 both in relatively high electrical resistance states, the normally-on switch device 112 can support a majority of the relatively high voltage received by the solid state resettable fuse 104, including, for example, high grid voltage that may be supplied to the solid state resettable fuse 104. Thus, although the voltage rating of the PTC resistive component 114 may be relatively limited, such as, for example, around eight volts (8V), the normally-on switch device 112 may support almost all of a relatively high voltage that can be supplied to the solid state resettable fuse 104 during at least an overcurrent event. Accordingly, referencing the example provided in FIG. 3, with a 400V DC current applied across the fuse terminals (for example the D and N terminals of the solid state resettable fuse 104 in FIG. 1A) to a solid state resettable fuse 104 having a PTC resistive component 114 electrical resistance of 400 ohms (Ω), the electrical current of the solid state resettable fuse 104 can be reduced to a leakage current that is below 20 mA. Such leakage current from the solid state resettable fuse 104 can be further reduced with a further increase in the electrical resistance of the PTC resistive component 114, such as, for example, increasing the electrical resistance of the PTC resistive component 114 in the present example above 400 ohms (Ω). As certain normally-on switch devices 112, such as, for example, certain SiC JFET devices, can support hundreds to thousands of volts, and as certain extra-low voltage PTC resistive components 114, such as, for example, extra-low voltage (ELV) PTC resistors, have relatively high current ratings in the tens of amperes, or the PTC resistance components 114 can be paralleled to increase the current rating, the voltage and current ratings of the solid state resettable fuse 104 can be extended. Accordingly, by extending the voltage and current ratings of the solid state resettable fuse 104, the associated PTC resistive component 114 of the solid state resettable fuse 104 may be used in a wider range of industrial applications that have a variety of larger voltage and current characteristics.

Thus, according to certain embodiments, the PTC resistive component 114 used in the solid state resettable fuse 104 can be structured to have a high current, low voltage rating, or, conversely, a low current, high voltage rating. Thus, the normally-on switch device 112 can be configured to increase the voltage rating of an associated solid state resettable fuse 104 that employs the use of a high-current but low-voltage PTC resistive component 114 and/or the increase the current rating of an associated solid state resettable fuse 104 that employs the use of a high-voltage but low-current PTC resistive component 114. Accordingly, the solid state resettable fuse 104 can simultaneously obtain the high voltage and high current ratings while also providing an automatically resettable overcurrent protection device. Accordingly, the combination of the PTC resistive component 114 with the normally-on switch device 112 can allow the solid state resettable fuse 104 to be rated for tens of amperes and hundreds of volts. Such increases that can be attained in both the current and voltage ratings of the solid state resettable fuse 104 may allow the solid state resettable fuse 104 to satisfy a wide range of electrical criteria and/or characteristics. Moreover, the versatility attained by the solid state resettable fuse 104 can allow the solid state resettable fuse 104 to be used in relatively low voltage applications, such as, for example, automotive applications, among other applications, as well as relatively high voltage applications, including, but not limited to, industrial, electrical distribution network, and building applications.

Figure 4A:
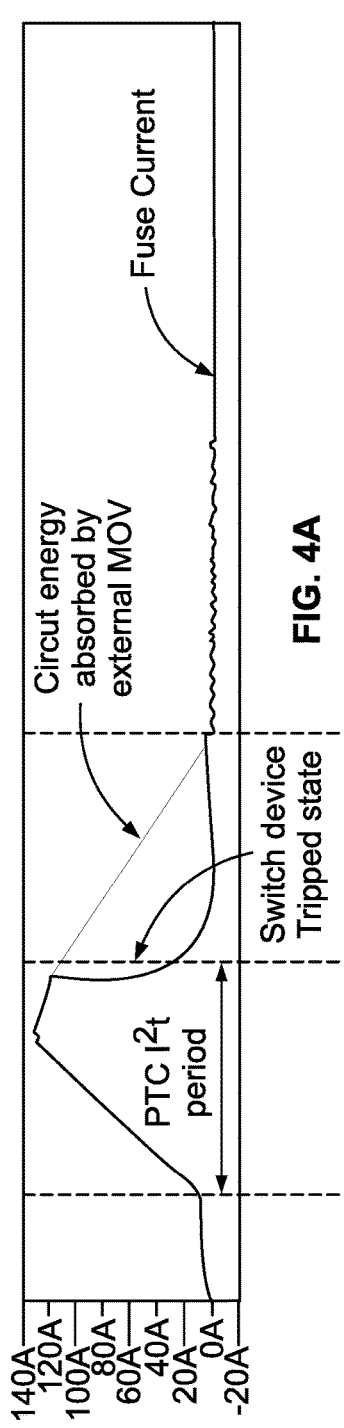
FIGS. 4A-4C illustrate example trip waveforms of an exemplary unidirectional solid state resettable fuse.
Figure 4B:
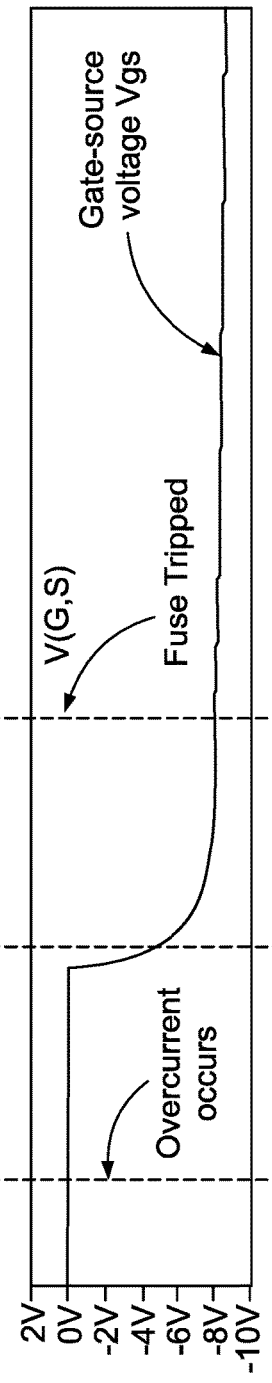
Figure 4C:
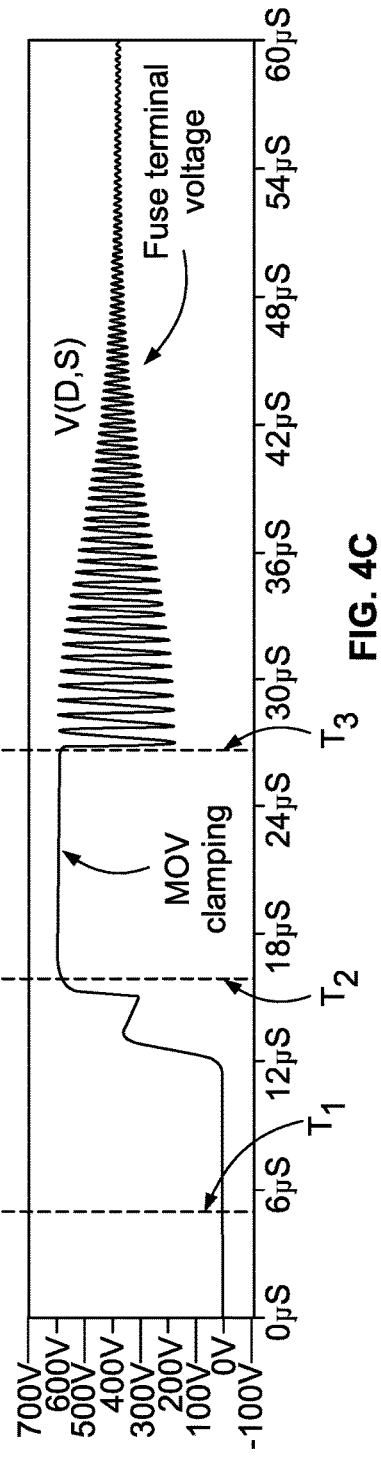

FIGS. 4A-4C illustrate example trip waveforms of a unidirectional solid state resettable fuse 104. Referencing FIG. 4A, a first time ($T_1$) just before 6 microseconds (6 μs) indicates the occurrence of an overcurrent event, namely a fault. Upon the occurrence of the fault, a fuse or load current of the solid state resettable fuse 104 increases from a relatively small current, if any, near 10 amps, to around 130 amps at 12 microseconds (12 μs). The increased electrical current of the solid state resettable fuse 104 can result in an increase in the temperature of the PTC resistive component 114. Such an increase in temperature of PTC resistive component 114 can result in the PTC resistive component 114 reaching the relatively high electrical resistance state at or around a second time ($T_2$). The duration of time for the PTC resistive component 114 to transition from the relatively low electrical resistance state to the relatively high resistance state can depend on a variety of different factors, including, but not limited to, the size of the current flowing through the PTC resistive component 114, the type of PTC resistive component 114, and/or the composition of the PTC resistive component 114, among other factors. The delay in time between the overcurrent event at the first time ($T_1$) and the PTC resistive component 114 transiting to the relatively high electrical resistance state ($T_2$) can be determined by the $I^2t$ trip characteristics of the PTC resistive component 114, as previously discussed. Moreover, the time before the PTC resistive component 114 transitions to the relatively high electrical resistance state can depend on certain characteristics of the PTC resistive component 114, including, for example, the type of PTC resistive component 114 and/or the properties of the materials of the PTC resistive component 114.

As illustrated by FIG. 4B, at or around the second time period ($T_2$), the electrical resistance of the PTC resistive component 114 can be at the high electrical resistance state, which can negatively increase the gate-source, or gate-source bias, voltage (Vgs) provided to the control terminal 116 with respect to the source terminal 118. In the present example, similar to the example discussed above with respect to FIG. 2, according to certain embodiments, the normally-on switch device 112 can have a negative eight volt (−8V) threshold voltage that can be attained relatively quickly so that the normally-on switch device 112 is turned to the tripped state relatively quickly. However, as previously discussed, when in the tripped state, the normally-on switch device 112 may still experience a degree of relatively small or leakage current that can generate a relatively small power loss for the normally-on switch device 112, but which can be managed by a heat sink 120, as discussed below.

According to certain embodiments, the circuit 100 can also include one or more varistors, such as, for example, an external metal oxide varistor (MOV), among other varistors or voltage dependent resistors, that are structured to provide over voltage protection. According to certain embodiments, the varistor can be connected in parallel to the solid state resettable fuse 104. In certain situations, residual energy that can be stored in the line inductance continues flowing through, which can be dampened or clamped by the varistor. According to the example depicted in FIGS. 4A and 4C in which the varistor is an external MOV, the MOV can absorb circuit energy before or around the second time ($T_2$) to around a third time ($T_3$), wherein the solid state resettable fuse 104 is placed in the tripped state so that the overcurrent event, such as an overcurrent fault, is interrupted and the fuse current decreases to almost zero, as shown in FIG. 4A.

When the overcurrent event, such as the fault, is removed or cleared, the small leakage current passing through the solid state resettable fuse 104 can be removed or eliminated. Additionally, with the overcurrent event removed, the temperature of the PTC resistive component 114 can be cooled such that the PTC resistive component 114 changes from the relatively high electrical resistance state back to the low electrical resistance state. Further, with the PTC resistive component 114 in the low electrical resistance state, the gate-source voltage (Vgs) of the normally-on switch device 112 is around, or at, zero volts (0V), and the solid state resettable fuse 104 returns from the tripped state to the on state such that the solid state resettable fuse 104 can be ready to resume providing overcurrent protection.

Further, as depicted in FIG. 1A, according to certain embodiments, the solid state resettable fuse 104 can include, or be electrically coupled to, a mechanical switch 115 that can also be tripped by a high terminal voltage. According to such embodiments, the mechanical switch 115 may trip when, or after, the solid state resettable fuse 104 has entered to the tripped state. Further, such a mechanical switch 115 can be structured to provide galvanic isolation so as to prevent current flow.

Figure 5:
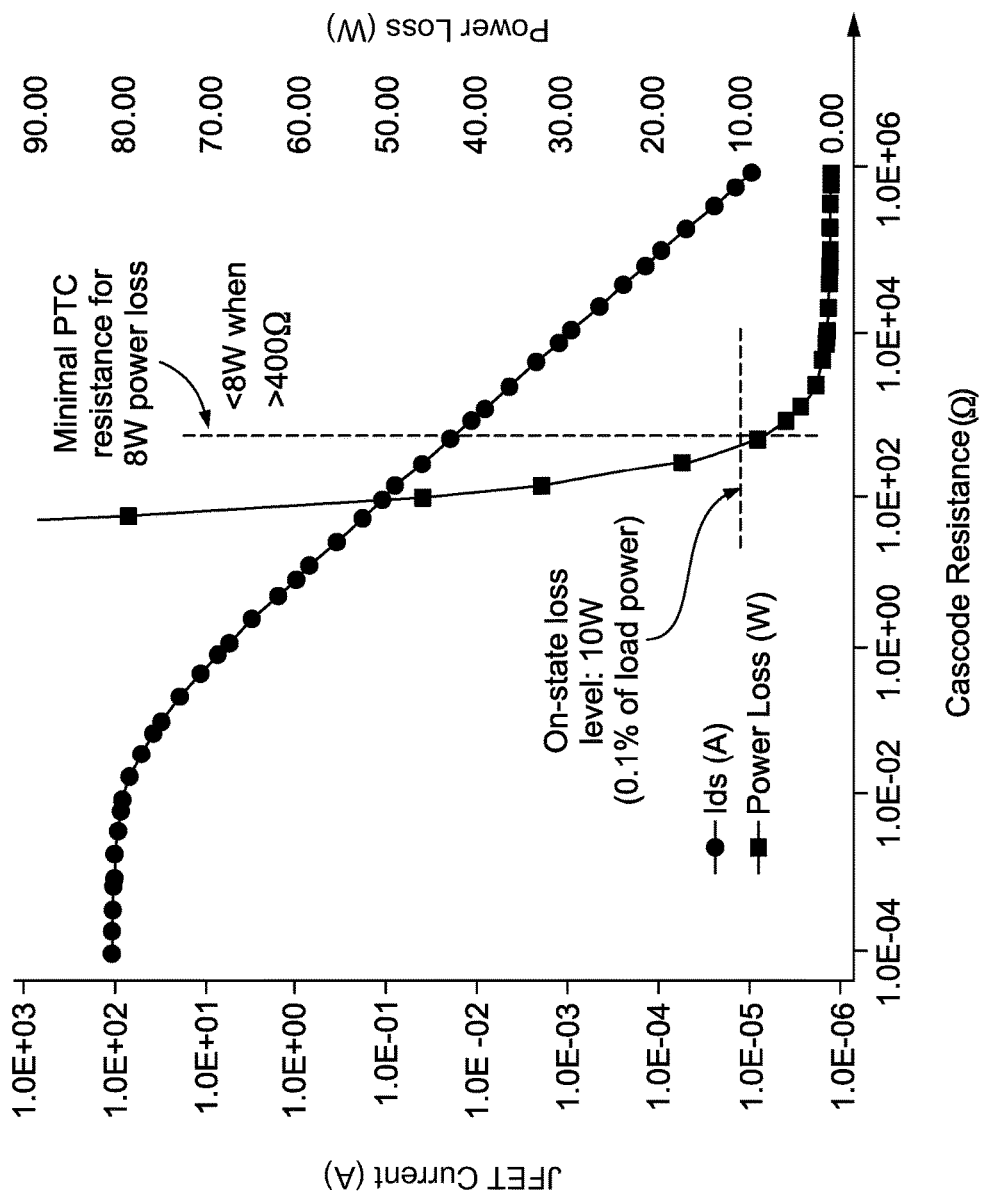
FIG. 5 illustrates exemplary power loss of an embodiment of the solid state resettable fuse in the tripped state as a function of the electrical resistance of a PTC resistive component of the solid state resettable fuse.

FIG. 5 illustrates exemplary power loss of an embodiment of the solid state resettable fuse 104 in the tripped state as a function of the electrical resistance of a PTC resistive component 114 of the solid state resettable fuse 104. As illustrated, information relating to the current (Ids) of the normally-on switch device 112 corresponds to the left vertical axis of the illustrated graph, while information corresponding to power loss, as expressed in terms of watts (W) is provided by the right vertical axis. When the solid state resettable fuse 104 is in the relatively high electrical resistance state, such as, for example, after the PTC resistive component 114 trips, and despite the solid state resettable fuse 104 being in an "off" or tripped state, a relatively small leakage current may still remain in, and/or pass through, the solid state resettable fuse 104. Often, such leakage current can be, but is not limited to, current that is in the milliamp (mA) range.

Since, in relatively high voltage applications, the normally-on switch device 112 supports the majority, if not almost all, of the voltage supplied to the solid state resettable fuse 104 when the solid state resettable fuse 104 is in the off or tripped state, the dominant power loss of the solid state resettable fuse 104 is from the normally-on switch device 112. However, as demonstrated by FIG. 5, in such situations, the off or tripped state power loss of the solid state resettable fuse 104 can be reduced by an increase of the electrical resistance of the PTC resistive component 114. For example, when the on-state resistance of the solid state resettable fuse 104 is more than 400 ohms (Ω), the power loss of the solid state resettable fuse 104 can be less than 8 watts (W). Since the on-state power loss of the solid state resettable fuse 104 in the embodiment illustrated in FIG. 5 is in the similar level of 10 watts (W) due to the relatively small load current, an 8 watt (W) off or tripped state power loss can also be manageable by a heat sink 120 (FIG. 1A) of the normally-on switch device 112 that is normally used for dissipating the power loss for on state operation of the solid state resettable fuse 104. Further, if the electrical resistance of the PTC resistive component 114 in the illustrated embodiment depicted in FIG. 5 is greater than ten kilohms (10 kΩ), the off-state power loss of the solid state resettable fuse 104 can be negligible. Thus, in an effort to control the off or tripped state loss of the solid state resettable fuse 104, according to certain embodiments, the minimal high electrical resistance state of the cascaded PTC resistive component 114 should be at least 400 ohms (Ω).

Figure 6:
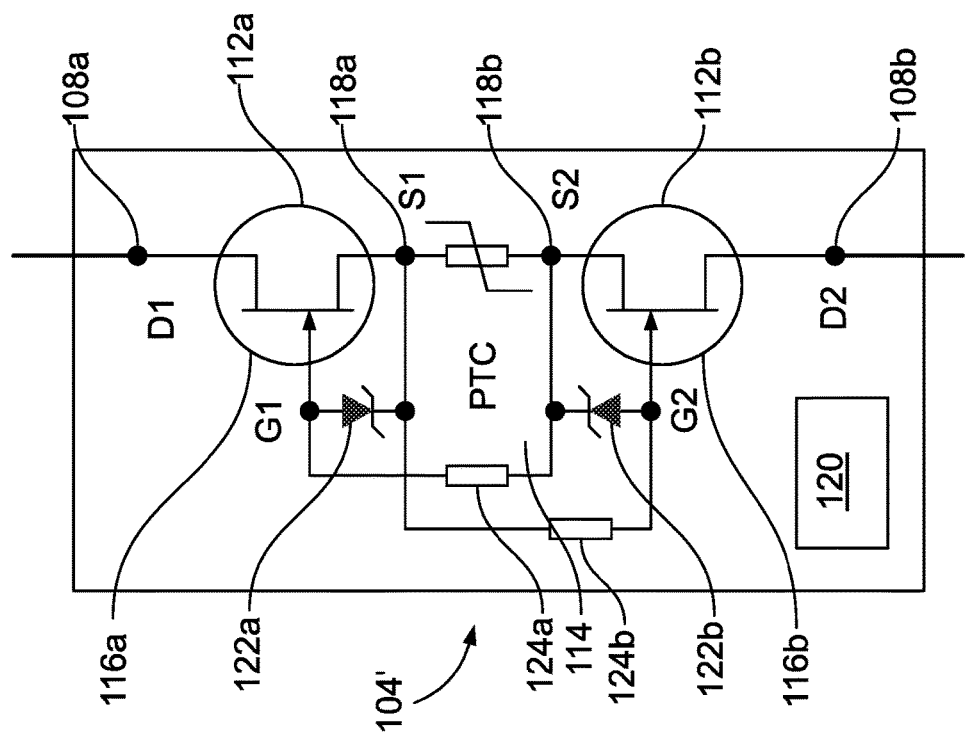
FIG. 6 illustrates a schematic representation of an exemplary bidirectional solid state resettable fuse.

FIG. 6 illustrates an exemplary embodiment of a bidirectional solid state resettable fuse 104'. The unidirectional and bidirectional solid state resettable fuses 104, 104' can be used in similar or dissimilar applications. For example, according to certain embodiments, the unidirectional solid state resettable fuse 104 depicted in FIG. 1A can be used in DC applications, such as, for example, applications in which a DC current is supplied to the unidirectional solid state resettable fuse 104. Conversely, according to certain embodiments, the bidirectional solid state resettable fuse 104' may be employed in AC applications, and more specifically, applications in which an AC current is supplied to the bidirectional solid state resettable fuse 104'. According to certain embodiments, the bidirectional solid state resettable fuse 104' includes a plurality of normally-on switch devices 116a, 116b, such as, for example, a pair normally-on power semiconductors, including one or more of a silicon carbide (SiC) junction gate field-effect transistor (JFET or JUGFET), a gallium nitride (GaN) high electron mobility transistor (HEMT), a heterostructure FET (HFET), and/or a modulation-doped FET (MODFET), among other devices. Moreover, according to the illustrated embodiment, the bidirectional solid state resettable fuse 104' includes first and second normally-on switch devices 116a, 116b, each of which includes, or is electrically coupled to, at least a line side terminal (D1, D2) 108*a*, 108*b* and a control terminal (G1, G2) 116*a*, 116*b*.

According to the illustrated embodiment, the bidirectional solid state resettable fuse 104' includes two source terminals (S1, S2) 118*a*, 118*b* of the normally-on switch devices 112*a*, 112*b* that are each electrically coupled to a corresponding terminal of the PTC resistive component 114, respectively. According to certain embodiments, each of the normally-on switch devices 112*a*, 112*b* can also be electrically coupled to one or more gate resistors 124*a*, 124*b* and one or more Zener diodes 122*a*, 122*b* that at least assist in attempting to prevent forward gate bias voltage, which may damage certain normally-on switch devices 116*a*, 116*b*, such as, for example, normally-on SiC JFETs, of one of the first and second normally-on switch devices 112*a*, 112*b* when the other of the first and second normally-on switch devices 112*a*, 112*b* is in the tripped state. Moreover, such blocking, which may alternate with the polarity of the AC current, may at least attempt to block AC voltage from passing through the bidirectional solid state resettable fuse 104'. Additionally, the Zener diodes 122*a*, 122*b* can provide additional protection or clamping of the maximal negative gate-source voltage (Vgs), such as, for example, protection or clamping of a negative sixteen volt (−16V) gate-source voltage (Vgs).

Further, although FIG. 6 illustrates a single normally-on switch device 112*a* and one second normally-on switch device 112*b*, according to certain embodiments, one or both of the first and second normally-on switch device 112*a*, 112*b* may comprise a plurality of normally-on switch devices 112*a*, 112*b*, such as, for example, normally-on power semiconductors connected to one or more PTC resistive components 114 in a super cascade arrangement. Similar to the embodiment discussed above with respect to FIG. 1D, such an arrangement may further increase the voltage blocking rating of the solid state resettable fuses 104'.

The operation of the bidirectional solid state resettable fuse 104' is similar to the unidirectional solid state resettable fuse 104. More specifically, the electrical resistance threshold value of the PTC resistive component 114 can influence the solid state resettable fuse 104' being in either the on state or the tripped state. For example, when the PTC resistive component 114 is in a relatively low electrical resistance state, the gate-source voltage (Vgs) of both of the normally-on switch devices 112*a*, 112*b* is close to, or at, zero volts. In such a situation, the normally-on switch devices 112*a*, 112*b* are turned on and electrical current can flow in a bidirectional manner such that the bidirectional solid state resettable fuse 104' can conduct AC current. However, when the electrical resistance of the PTC resistive component 114 attains a relatively high electrical resistance state during or in response to overcurrent events, the gate-source voltage (Vgs) can be negatively increased beyond a threshold trip voltage such that the normally-on switch devices 112*a*, 112*b* can alternately turned from the on state to the tripped state such that the bidirectional solid state resettable fuse 104' blocks the passage of AC voltage in either direction through the bidirectional solid state resettable fuse 104.

FIGS. 7A-7C illustrate examples of trip waveforms and bipolar voltage blocking waveforms of a bidirectional solid state resettable fuse 104'. In the illustrated example, at a first time period ($T_1$), an overcurrent event occurs, such as, for example, an overcurrent fault. A temperature of the PTC resistive component 114 may then begin to increase as the amount of current passing through the PTC resistive component 114 increases such that the PTC resistive component 114 transitions from the relatively low electrical resistance state to the relatively high electrical resistance state. As previously discussed, the duration of time before the PTC resistive component 114 is tripped at the relatively high electrical resistance state can be based on a variety of circumstances, including, for example, the trip ($I^2t$) characteristics of the PTC resistive component 114.

As depicted in FIGS. 7A-7C, the bidirectional solid state resettable fuse 104' can block a grid AC voltage in both polarities. Moreover, as shown, the PTC resistive component 114 can trip when the grid AC voltage is in the positive half cycle. Therefore, the voltage across the PTC resistive component 114 can create a negative gate-source bias ("Vgs1") for the first normally-on switch device 112*a* ("Switch Device 1"), which is illustrated in FIG. 7C as being around the negative threshold voltage, which in this example is around eight volts (−8V). Therefore, the first normally-on switch device 112*a* is transitioned to the tripped state. Further, with the PTC resistive component 114 in the relatively high electrical resistance state and the first normally-on switch device 112 in the tripped state, leakage current of the solid state resettable fuse 104 can create a positive voltage across the PTC resistive component 114 in the positive half cycle of the grid AC voltage.

With respect to the second normally-on switch device 112*b* ("Switch Device 2"), the gate-source voltage ("Vgs2") is clamped to zero volts (0V) by the associated diode 122*b* in the positive half cycle, which otherwise may damage the control terminal, such as, for example, a gate terminal, with forward bias voltage and large gate current. Thus, the second normally-on switch device 112*b* can be reversely turned on in at least an attempt to avoid a reverse breakdown, as the reverse blocking capabilities of at least certain types of the normally open switch devices 112*a*, 112*b* can be relatively low. Therefore, in the positive half cycle of the grid AC voltage, the first normally-on switch device 112*a* is in a blocking state and the second normally-on switch device 112*b* is on state, and the total leakage current is minimized by the first normally-on switch device 112*a*. Additionally, in such a situation, the gate resistor 124*b* associated with the second normally-on switch device 112*b* can limit the total leakage current of the bidirectional solid state resettable fuse 104'. Similarly, in the negative half cycle of the grid AC voltage, the second normally-on switch device 112*b* can block the high grid AC voltage, and the first normally-on switch device 112*a* is in the on state. Thus, the first and second normally-on switch devices 112*a*, 112*b* can alternatively block the grid AC voltage in the positive polarity and the negative polarity. The corresponding gate source voltages (Vgs1, Vgs2) also can alternate between around zero volts (0V) and the threshold voltage, which in this example is around negative eight volts (−8V). Further, the bidirectional solid state resettable fuse 104' may have a relatively small AC leakage current, such as, for example an AC leakage current that passes through the bidirectional solid state resettable fuse 104' that is in the mA range. Thus, such operation of the bidirectional solid state resettable fuse 104' can effectively interrupted the corresponding circuit.

While the invention has been described in connection with what is presently considered to be the most practical and preferred embodiment, it is to be understood that the invention is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law. Furthermore it should be understood that while the use of the word preferable, preferably, or preferred in the description above indicates that feature so described may be more desirable, it nonetheless may not be necessary and any embodiment lacking the same may be contemplated as within the scope of the invention, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

The invention claimed is:

1. A solid state resettable fuse comprising:
a positive temperature coefficient resistive component being automatically resettable from a high electrical resistance state to a low electrical resistance state, the positive temperature coefficient resistive component having a resistance to a flow of an electrical current through the positive temperature coefficient resistive component, the resistance being higher for the high electrical resistance state than for the low electrical resistance state; and
a normally-on switch device having a control terminal electrically coupled to the positive temperature coefficient resistive component, the control terminal configured to receive a control signal at least when the positive temperature coefficient resistive component is in the high electrical resistance state, the control terminal configured to adjust the normally-on switch device from an on state to a tripped state in response to the received control signal, and
wherein the solid state resettable fuse outputs a leakage current when the normally-on switch device is in the tripped state.

2. The solid state resettable fuse of claim 1, wherein the control signal is a gate-source voltage.

3. The solid state resettable fuse of claim 2, wherein the gate-source voltage is a negative voltage.

4. The solid state resettable fuse of claim 2, wherein the positive temperature coefficient resistive component is in the low electrical resistance state when a temperature of the positive temperature coefficient resistive component is below a threshold temperature, and wherein the positive temperature coefficient resistive component is in the high electrical resistance state when the temperature of the positive temperature coefficient resistive component exceeds the threshold temperature.

5. The solid state resettable fuse of claim 4, wherein the normally-on switch device is a normally-on wide bandgap semiconductor, and wherein the control terminal is a gate.

6. The solid state resettable fuse of claim 5, wherein the solid state resettable fuse is a passive electronic device.

7. The solid state resettable fuse of claim 4, wherein the positive temperature coefficient resistive component is a polymer positive temperature coefficient resettable fuse.

8. The solid state resettable fuse of claim 4, wherein the positive temperature coefficient resistive component is one of a bi-metal based thermal breaker and a memory shape alloy based thermal breaker.

9. The solid state resettable fuse of claim 4, wherein the positive temperature coefficient resistive component comprises a polymer positive temperature coefficient resettable fuse that is connected in parallel to a bi-metal based thermal breaker or a memory shape alloy based thermal resistor.

10. The solid state resettable fuse of claim 1, wherein the normally-on switch device comprises a plurality of normally-on power semiconductors connected to the positive temperature coefficient resistive component in a super cascade arrangement.

11. The solid state resettable fuse of claim 1, further including a switch in electrical communication with the normally-on switch device, the switch structure to provide galvanic isolation so as to prevent current flow in response to an overcurrent event.

12. A solid state resettable fuse comprising:
a positive temperature coefficient resistive component having a low electrical resistance state and a high electrical resistance state, the positive temperature coefficient resistive component configured to reset from the high electrical resistance state to the low electrical resistance state in response to a temperature of the positive temperature coefficient resistive component being below a threshold temperature; and
a first normally-on switch device in a cascade arrangement with the positive temperature coefficient resistive component, the first normally-on switch device adjustable from at least a first on state to a first tripped state in response to at least the positive temperature coefficient resistive component being transitioned from the low electrical resistance state to the high electrical resistance state, and wherein the solid state resettable fuse outputs a leakage electrical current at least when the first normally-on switch device is in the first tripped state.

13. The solid state resettable fuse of claim 12, wherein the positive temperature coefficient resistive component transitions from the low electrical resistance state to the high electrical resistance state at least when the temperature exceeds the threshold temperature.

14. The solid state resettable fuse of claim 13, wherein the normally-on switch device is a normally-on wide bandgap semiconductor.

15. The solid state resettable fuse comprising of claim 14, wherein the normally-on switch device includes a control terminal that is adjustable in response to a voltage drop across the positive temperature coefficient resistive component at least when the positive temperature coefficient resistive component transitions from the low electrical resistance state to the high electrical resistance state.

16. The solid state resettable fuse of claim 15, wherein the positive temperature coefficient resistive component is a polymer positive temperature coefficient resettable fuse.

17. The solid state resettable fuse of claim 15, wherein the positive temperature coefficient resistive component is one of a bi-metal based thermal breaker and a memory shape alloy based thermal breaker.

18. The solid state resettable fuse of claim 15, wherein the positive temperature coefficient resistive component comprises a polymer positive temperature coefficient resettable fuse that is connected in parallel to a bi-metal based thermal breaker or a memory shape alloy based thermal resistor.

19. The solid state resettable fuse of claim 12, further including a second normally-on switch device in a cascade arrangement with the positive temperature coefficient resistive component, the second normally-on switch device adjustably operable in at least a second on state and a second tripped state in response to at least the positive temperature coefficient resistive component being transitioned from the low electrical resistance state to the high electrical resistance state.

20. The solid state resettable fuse of claim 19, wherein the first normally-on switch device is configured to be in the first tripped state when the positive temperature coefficient resettable is in the high electrical resistance state and the solid state resettable fuse is receiving a current having a first polarity, the second normally-on switch device being in a on state when the first normally-on switch device is in the first tripped state, and wherein the second normally-on switch device is configured to be in the second tripped state when the positive temperature coefficient resettable is in the high electrical resistance state and the solid state resettable fuse is receiving a current having a second polarity that is opposite of the first polarity, the first normally-on switch device being in a on state when the second normally-on switch device is in the second tripped state.

21. The solid state resettable fuse of claim 20, wherein the first normally-on switch device is electrically coupled to a first gate resistor and a first Zener diode, the first gate resistor and the first Zener diode being arranged to prevent a high gate current of the first normally-on switch device, and further wherein the second normally-on switch device is electrically coupled to a second gate resistor and a second Zener diode, the second gate resistor and the second Zener diode being arranged to prevent a high gate current of the second normally-on switch device.

22. The solid state resettable fuse of claim 20, wherein the first normally-on switch device comprises a first plurality of normally-on power semiconductors connected to the positive temperature coefficient resistive component in a super cascade arrangement, and wherein the second normally-on switch device comprises a second plurality of normally-on power semiconductors connected to the positive temperature coefficient resistive component in a super cascade arrangement.

23. A method comprising:
creating, in response to an overcurrent event, a voltage drop across a positive temperature coefficient resistive component;
adjusting, in response to the created voltage drop, a gate-source voltage;
adjusting, in response to the adjusted gate-source voltage, the normally-on power semiconductor device from an on state to a tripped state; and
interrupting, when the normally-on power semiconductor is adjusted to the tripped state, a circuit, and wherein a leakage current flows from the normally-on power semiconductor device when in the tripped state.

24. The method of claim 23, wherein the step of adjusting the normally-on power semiconductor device from the on state to the tripped state includes adjusting, by a gate of the normally-on power semiconductor device, a resistance of the normally-on power semiconductor device.

25. The method of claim 24, wherein the step of creating a voltage drop comprises increasing a resistance across the positive temperature coefficient resistive component, and wherein the step of adjusting the gate-source voltage includes increasing a negativity of the voltage of the gate-source voltage.

* * * * *